US011062937B2

(12) United States Patent
Cheng et al.

(10) Patent No.: US 11,062,937 B2
(45) Date of Patent: Jul. 13, 2021

(54) DIELECTRIC ISOLATION FOR NANOSHEET DEVICES

(71) Applicant: INTERNATIONAL BUSINESS MACHINES CORPORATION, Armonk, NY (US)

(72) Inventors: Kangguo Cheng, Albany, NY (US); Ruilong Xie, Niskayuna, NY (US); Tenko Yamashita, Schenectady, NY (US); Chun-Chen Yeh, Danbury, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/245,285

(22) Filed: Jan. 11, 2019

(65) Prior Publication Data

US 2020/0227305 A1    Jul. 16, 2020

(51) Int. Cl.
| | |
|---|---|
| *H01L 21/764* | (2006.01) |
| *H01L 29/786* | (2006.01) |
| *H01L 29/66* | (2006.01) |
| *H01L 21/02* | (2006.01) |
| *H01L 29/423* | (2006.01) |

(52) U.S. Cl.
CPC ........ *H01L 21/764* (2013.01); *H01L 21/0217* (2013.01); *H01L 29/42392* (2013.01); *H01L 29/66545* (2013.01); *H01L 29/78696* (2013.01)

(58) Field of Classification Search
CPC ............ H01L 21/764; H01L 29/78696; H01L 29/66545; H01L 21/0217; H01L 29/42392
See application file for complete search history.

(56) References Cited

U.S. PATENT DOCUMENTS

| | | | |
|---|---|---|---|
| 9,443,856 B2 | 9/2016 | Ching et al. | |
| 9,490,323 B2 | 11/2016 | Rodder et al. | |
| 9,653,547 B1 * | 5/2017 | Chang | ................. H01L 29/0673 |
| 9,941,352 B1 | 4/2018 | Bi et al. | |
| 9,984,936 B1 | 5/2018 | Xie et al. | |
| 9,991,261 B2 | 6/2018 | Mitard | |
| 10,014,390 B1 * | 7/2018 | Bouche | ............... H01L 29/0665 |
| 10,103,238 B1 * | 10/2018 | Zang | ..................... H01L 21/311 |
| 10,263,100 B1 * | 4/2019 | Bi | ..................... H01L 29/78654 |
| 10,388,732 B1 * | 8/2019 | Frougier | ............ H01L 29/1033 |
| 10,490,559 B1 * | 11/2019 | Ando | .................. H01L 27/1116 |
| 2012/0017978 A1 | 1/2012 | Doraiswami et al. | |
| 2014/0011697 A1 | 1/2014 | Vasan et al. | |
| 2014/0291726 A1 | 10/2014 | Pillarisetty et al. | |
| 2015/0262861 A1 | 9/2015 | Hung et al. | |
| 2016/0254180 A1 | 9/2016 | Liu et al. | |

(Continued)

*Primary Examiner* — Eugene Lee
(74) *Attorney, Agent, or Firm* — Cantor Colburn LLP; Joseph Petrokaitis

(57) ABSTRACT

A technique relates to a semiconductor device. A stack is formed over a bottom sacrificial layer, and the bottom sacrificial layer is on a substrate. The bottom sacrificial layer is removed so as to create an opening under the stack, and a dummy gate anchors the stack. A support structure is formed in the opening, and the support structure includes an air gap and is positioned between the stack and the substrate. One or more layers are formed on the support structure. Source or drain regions are formed over the one or more layers, such that the source or drain regions are isolated from the substrate.

11 Claims, 15 Drawing Sheets

(56) References Cited

U.S. PATENT DOCUMENTS

2017/0141212 A1\* 5/2017 Barraud ............ H01L 21/02667
2018/0090493 A1   3/2018 Kwak et al.
2019/0341450 A1\* 11/2019 Lee ................. H01L 21/823864

\* cited by examiner

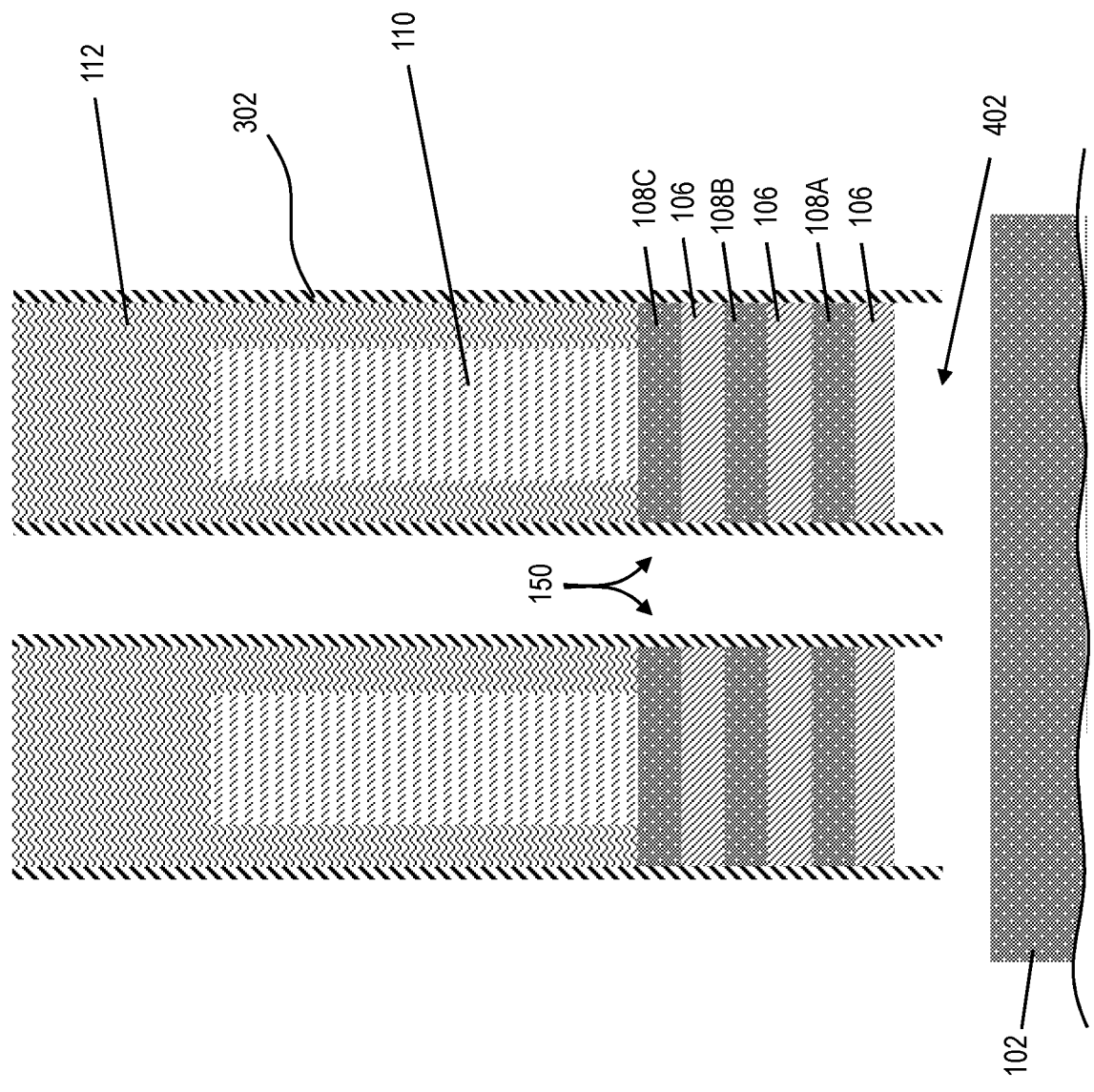

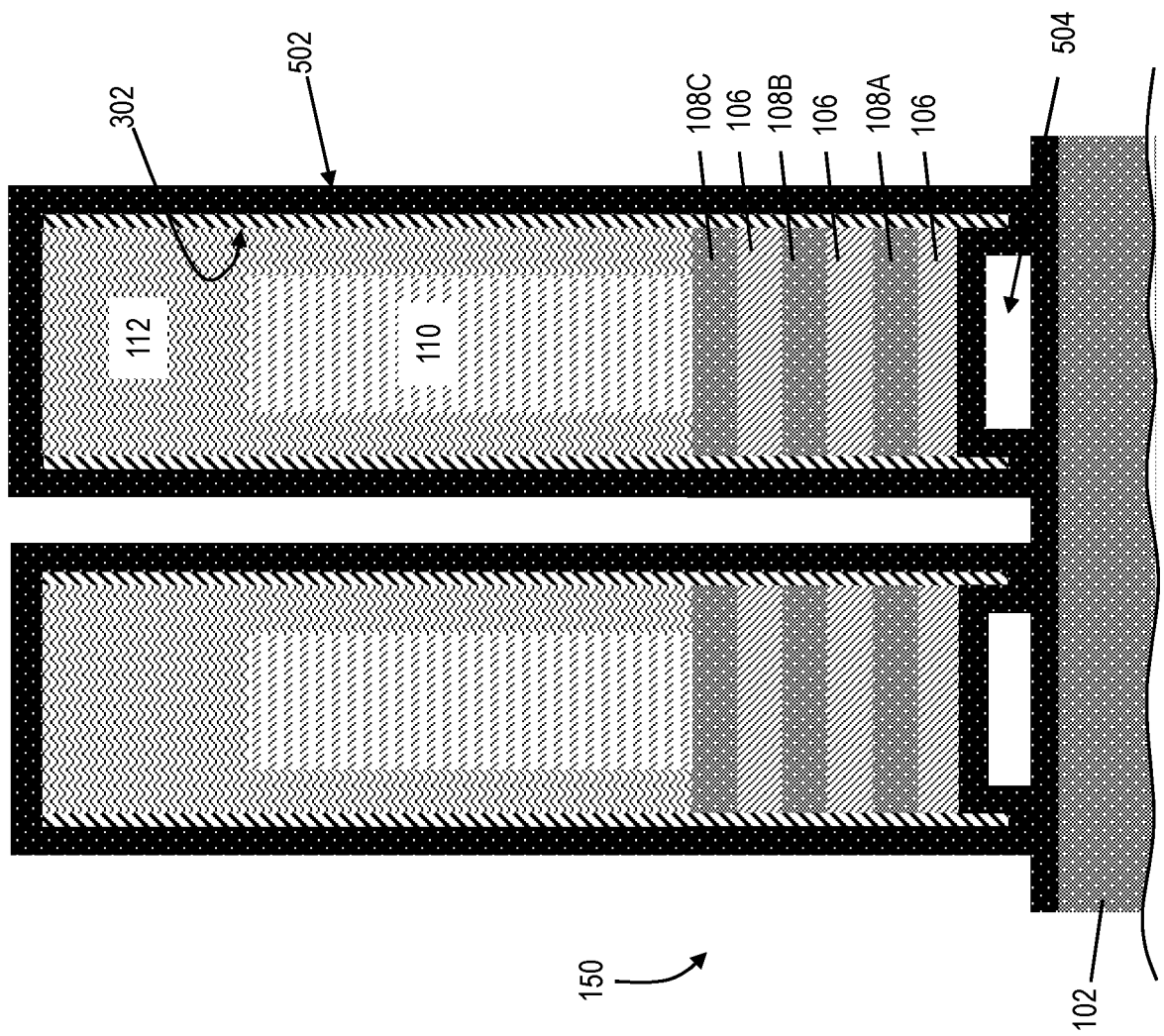

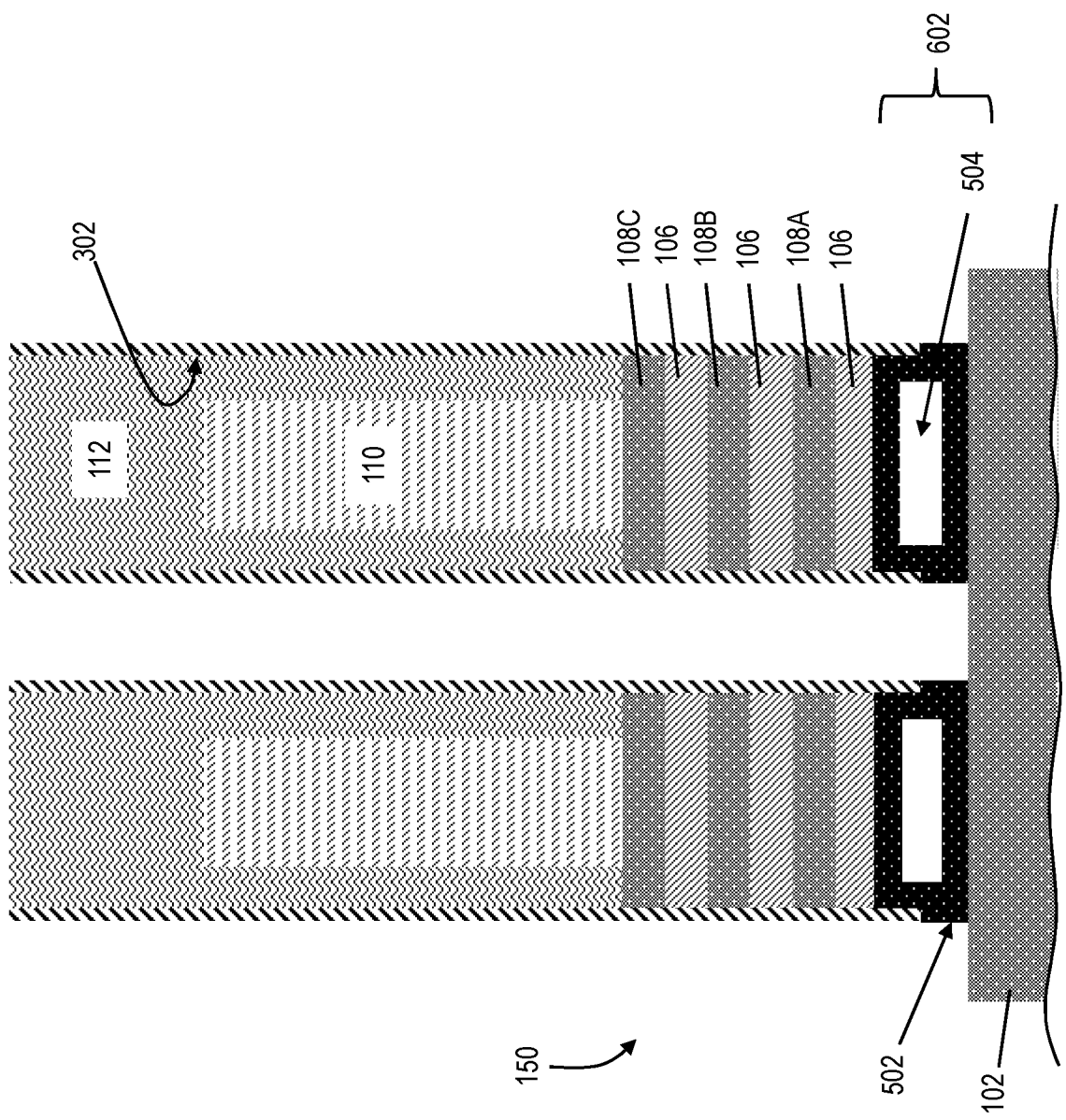

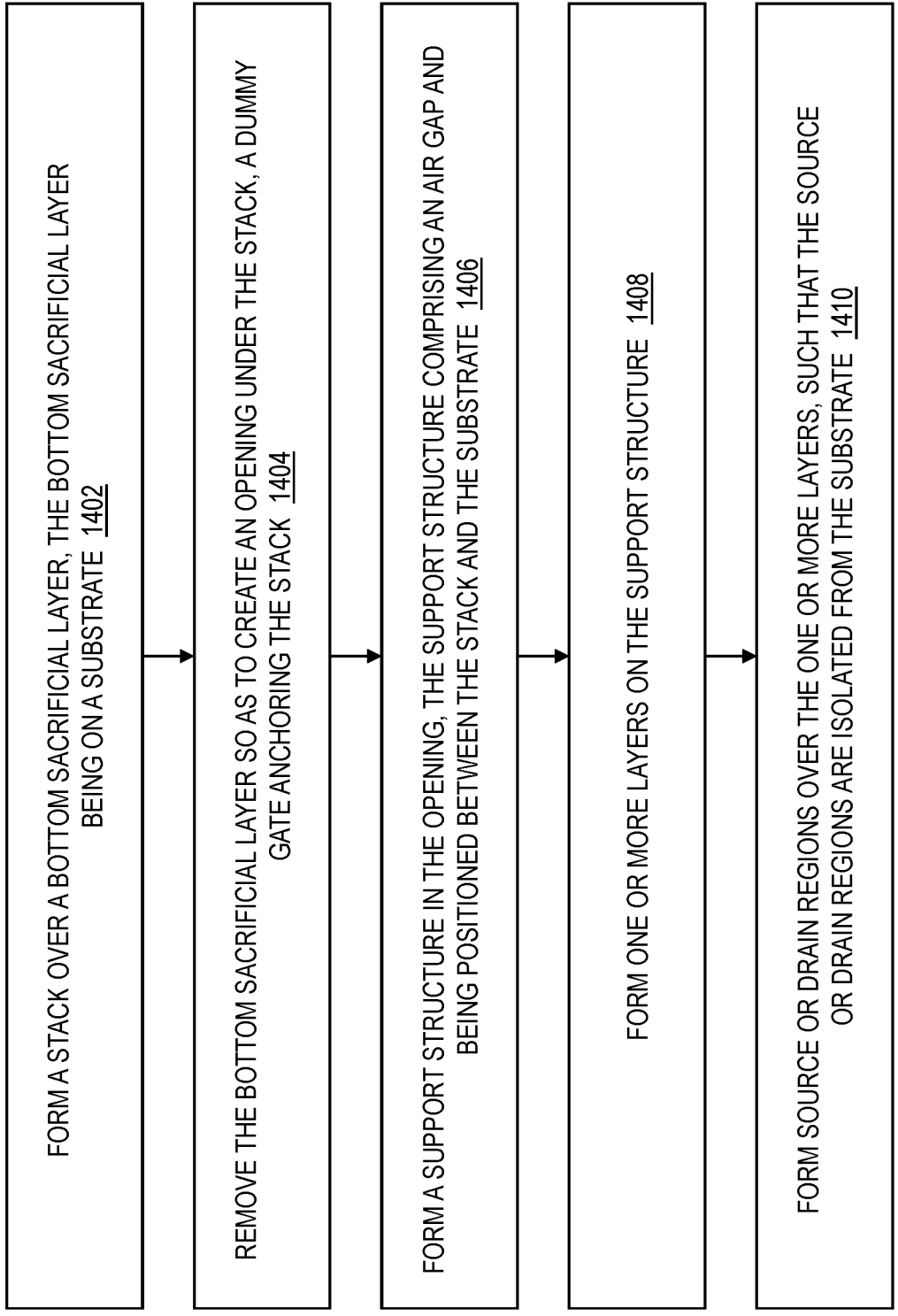

DIELECTRIC ISOLATION FOR NANOSHEET DEVICES

BACKGROUND

The present invention generally relates to fabrication methods and resulting structures for semiconductor devices, and more specifically, to formation of dielectric isolation for nanosheet devices.

In contemporary semiconductor device fabrication processes, a large number of semiconductor devices, such as n-type field effect transistors (NFETs) and p-type field effect transistors (PFETs), are fabricated on a single wafer. Non-planar transistor device architectures, such as nanosheet (or nanowire) transistors, can provide increased device density and increased performance over planar transistors. Nanosheet transistors, in contrast to conventional planar FETs, include a gate stack that wraps around the full perimeter of multiple nanosheet channel regions for improved control of channel current flow. Nanosheet transistor configurations enable fuller depletion in the nanosheet channel regions and reduce short-channel effects.

SUMMARY

Embodiments of the invention are directed to a method for forming a semiconductor device. A non-limiting example of the method includes forming a stack over a bottom sacrificial layer, the bottom sacrificial layer being on a substrate, and removing the bottom sacrificial layer so as to create an opening under the stack, a dummy gate anchoring the stack. Also, the method includes forming a support structure in the opening, the support structure having an air gap and being positioned between the stack and the substrate, forming one or more layers on the support structure, and forming source or drain regions over the one or more layers, such that the source or drain regions are isolated from the substrate.

Embodiments of the invention are directed to a semiconductor device. A non-limiting example of the semiconductor device includes a support structure having an air gap and positioned between a stack and a substrate, and one or more layers formed on a portion of the support structure. Also, the semiconductor device includes source or drain regions formed over the one or more layers, such that the source or drain regions are isolated from the substrate, and a conductive gate structure formed over the support structure.

Embodiments of the invention are directed to a method for forming a semiconductor device. A non-limiting example of the method includes forming a stack over a bottom sacrificial layer, the bottom sacrificial layer being on a substrate, forming a dummy gate over the stack, forming a protective liner on the stack, and removing the bottom sacrificial layer so as to create an opening under the stack while the protective liner is on the stack, the dummy gate anchoring the stack. The method includes forming a support structure in the opening, the support structure having an air gap and being positioned between the stack and the substrate, removing the protective liner, forming one or more layers on the support structure, and forming source or drain regions over the one or more layers, such that the source or drain regions are isolated from the substrate.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 4B depicts a cross-sectional view of the semiconductor device taken along line X of FIG. 4A according to embodiments of the invention;

FIG. 5 depicts a cross-sectional view of the semiconductor device according to embodiments of the invention;

FIG. 6 depicts a cross-sectional view of the semiconductor device according to embodiments of the invention;

FIG. 14 depicts a flowchart of a method of forming a semiconductor device according to embodiments of the invention.

Figure 1:
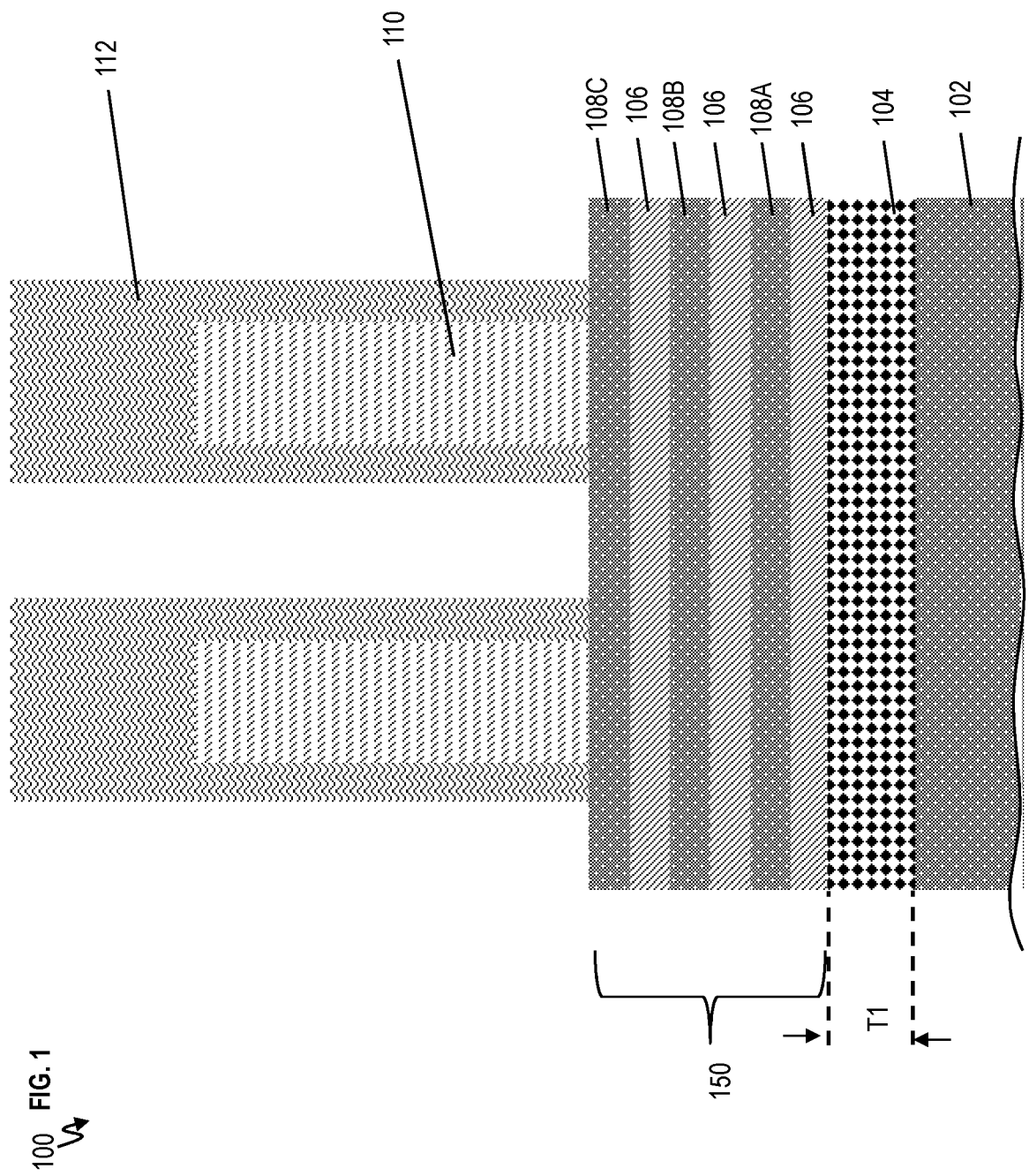
FIG. 1 depicts a cross-sectional view of a semiconductor device according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, a metal-oxide-semiconductor field-effect transistors (MOSFET) is used for amplifying or switching electronic signals. The MOSFET has a source, a drain, and a metal oxide gate electrode. The metal gate portion of the metal oxide gate electrode is electrically insulated from the main semiconductor n-channel or p-channel by a thin layer of insulating material, for example, silicon dioxide or glass, which makes the input resistance of the MOSFET relatively high. The gate voltage controls whether the current path from the source to the drain is an open circuit ("off") or a resistive path ("on"). N-type field effect transistors (NFET) and p-type field effect transistors (PFET) are two types of complementary MOSFETs. The NFET includes n-doped source and drain junctions and uses electrons as the current carriers. The PFET includes p-doped source and drain junctions and uses holes as the current carriers. Complementary metal oxide semiconductor (CMOS) is a technology that uses complementary and symmetrical pairs of p-type and n-type MOSFETs to implement logic functions.

The wafer footprint of an FET is related to the electrical conductivity of the channel material. If the channel material has a relatively high conductivity, the FET can be made with a correspondingly smaller wafer footprint. A known method of increasing channel conductivity and decreasing FET size is to form the channel as a nanostructure. For example, a so-called gate-all-around (GAA) nanosheet FET is a known architecture for providing a relatively small FET footprint by forming the channel region as a series of nanosheets. In a known GAA configuration, a nanosheet-based FET includes a source region, a drain region and stacked nanosheet channels between the source and drain regions. A gate surrounds the stacked nanosheet channels and regulates electron flow through the nanosheet channels between the source and drain regions. GAA nanosheet FETs are fabricated by forming alternating layers of channel nanosheets and sacrificial nanosheets. The sacrificial nanosheets are released from the channel nanosheets before the FET device is finalized. For n-type FETs, the channel nanosheets are typically silicon (Si) and the sacrificial nanosheets are typically silicon germanium (SiGe). For p-type FETs, the channel nanosheets can be SiGe and the sacrificial nanosheets can be Si. In some implementations, the channel nanosheet of a p-type FET can be SiGe or Si, and the sacrificial nanosheets can be Si or SiGe. Forming the GAA nanosheets from alternating layers of channel nanosheets formed from a first type of semiconductor material (e.g., Si for n-type FETs, and SiGe for p-type FETs) and sacrificial nanosheets formed from a second type of semiconductor material (e.g., SiGe for n-type FETs, and Si for p-type FETs) provides superior channel electrostatics control, which is necessary for continuously scaling gate lengths down to seven (7) nanometer CMOS technology and below. The use of multiple layered SiGe/Si sacrificial/channel nanosheets (or Si/SiGe sacrificial/channel nanosheets) to form the channel regions in GAA FET semiconductor devices provides desirable device characteristics, including the introduction of strain at the interface between SiGe and Si.

For nanosheet devices formed on a bulk substrate, the source and drain regions are epitaxially grown from the side of the silicon nanosheets and the bottom silicon substrate. This leads to parasitic source and drain leakage currents, which can harm nanosheet FET performance. Particularly, the combination of epitaxially grown nanosheet stack contacting the substrate in the source/drain region and the high-k metal gate (HKMG) stack formed directly on the substrate in the sub-fin region form a bottom parasitic planar transistor degrading the performance of the gate-all-around nanosheet-FET. Accordingly, a better integration scheme is needed.

Turning now to an overview of the aspects of the invention, one or more embodiments of the invention provide semiconductor devices and methods of forming the semiconductor devices. Embodiments of the invention provide integration methods to form bottom dielectric isolation of nanosheet FETs. Accordingly, a bottom dielectric isolation layer isolates the source and drain regions from the substrate and/or isolates the nanosheet region from the substrate. Particularly, embodiments of the invention provide silicon-on-insulator (SOI) like isolation on a bulk substrate without requiring additional masks to form anchors in the fabrication process. Further, embodiments of the invention provide full air gap isolation.

Turning now to a more detailed description of aspects of the present invention, FIG. 1 depicts a cross-sectional view of a semiconductor device 100 according to embodiments of the invention. The semiconductor device 100 includes a substrate 102 formed from a semiconductor material. In embodiments of the invention, the semiconductor material of the substrate 102 can be silicon (Si), although other materials can be used/included. However, the substrate 102 would not be silicon germanium (e.g., having a percentage of germanium that would etched with sacrificial layers discussed herein) because of selectivity for subsequent etching during fabrication processed. After initial fabrication processing, a sacrificial bottom isolation layer 104 is formed on top of the substrate 102. After forming the sacrificial bottom isolation layer 104, a nanosheet stack 150 is then formed. The nanosheet stack 150 includes sacrificial layers 106 alternatingly formed (e.g., epitaxially grown) with channel layer 108A, 108B, and 108C. The channel layer 108A, 108B, and 108C can be generally referred to as channel layers 108. Although three channel layers 108 are shown, more or fewer channel layers 108 can be used, and the number of sacrificial layers 106 will be increased or decreased accordingly. The sacrificial bottom isolation layer 104, sacrificial layers 106, and channel layers 108 can be epitaxially grown.

The sacrificial bottom isolation layer 104 is a material that can be removed (i.e., etched) without etching the layers in the stack 150. That is, the sacrificial bottom isolation layer 104 can be etched selective to the sacrificial layers 106 and the channel layers 108. The sacrificial bottom isolation layer 104 can be silicon germanium (SiGe). To cause the sacrificial bottom isolation layer 104 to be removed/etched without etching the other layers, the sacrificial bottom isolation layer 104 can be SiGe$_y$% where the atomic percent % for "y" ranges from 45-70% atomic percent. Particularly, y in SiGe$_y$% of sacrificial bottom isolation layer 104 can be about (or at least) 50% atomic percent such that the sacrificial bottom isolation layer 104 can be etched/removed without etching layers 106 and 108.

Figure 2:
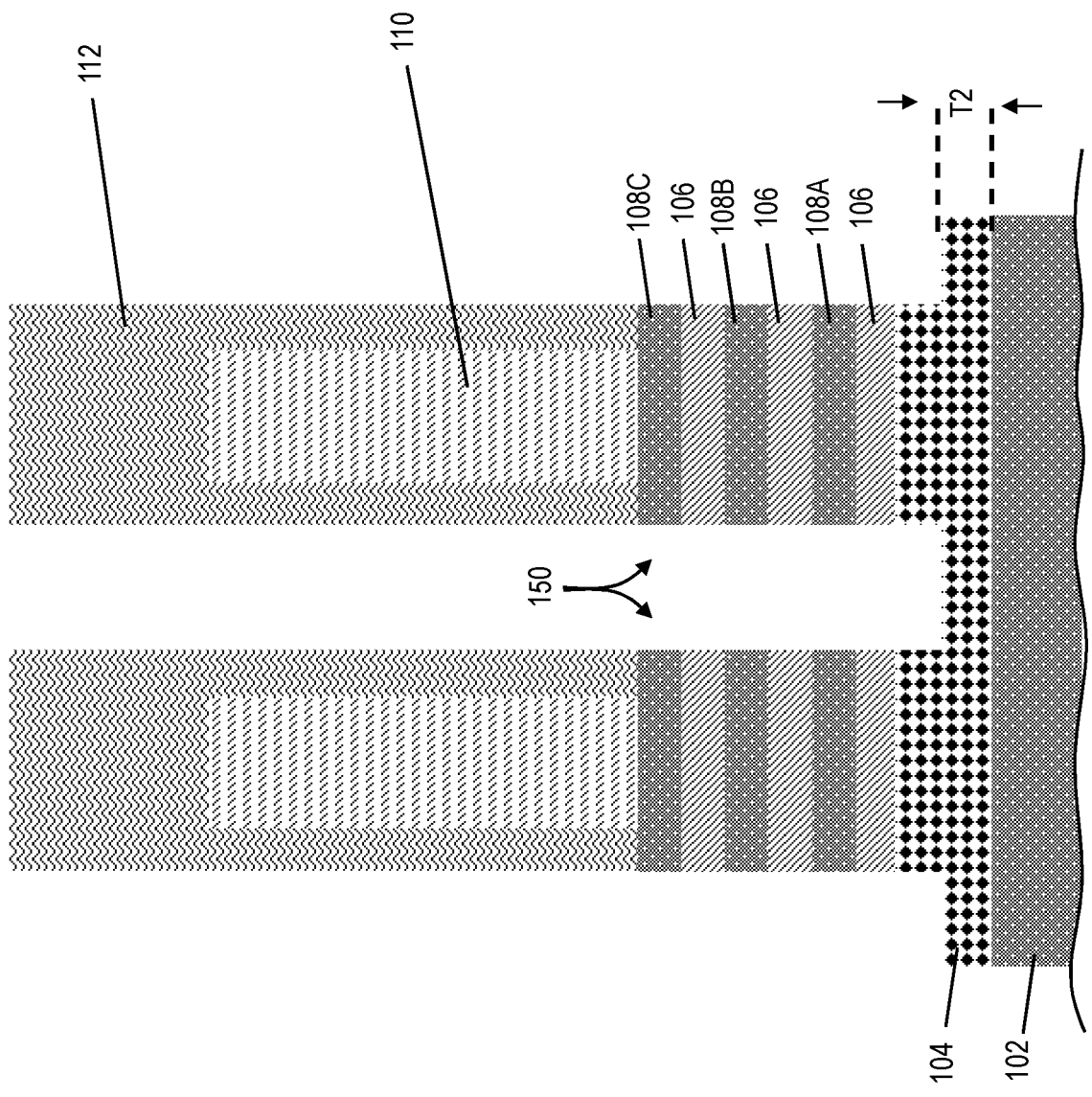
FIG. 2 depicts a cross-sectional view of the semiconductor device according to embodiments of the invention.

The material of the sacrificial layers 106 can also include SiGe$_x$% where the atomic percent % for "x" ranges from about 15-35% atomic percent (i.e., x is less than y). Particularly, the atomic percent % for x can be about 20% for the sacrificial layers 106. The material of the channel layers 108 can include Si. The height or thickness T1 of the sacrificial bottom isolation layer 104 can range from about 12 nm to 50 nm in FIG. 1. The height or thickness of lower portions of the sacrificial bottom isolation layer 104 is reduced to T2 as depicted in FIG. 2, and height or thickness T2 can range from about 6 nm to 15 nm relative to the original height or thickness T1. Also, the height or thickness T2 can range from about 10 nm to 18 nm, which provides a good process window for further fabrication processes.

Referring to FIG. 1, using semiconductor lithography, dummy gates 110 (also are formed on top of the upper channel layer 108C. For example, gate patterning is performed to etch the dummy gate material into the patterned dummy gates 110. The dummy gates 110 can be formed by depositing dummy gate material, such as, amorphous silicon or polycrystalline silicon (poly silicon), on top of the stack 150. A gate hard mask (not shown) can be formed and utilized to pattern the dummy gates 110, and subsequently removed. Spacers 112 are formed on the dummy gates 110. For example, spacer material can be deposited and reactive ion etching (RIE) can be used to pull down the spacer material, thereby forming spacers 112. The spacers 112 can be a nitride based material such as silicon boron carbide nitride (SiBCN).

FIG. 2 depicts a cross-sectional view of a semiconductor device 100 according to embodiments of the invention. As seen in FIG. 2, etching is performed to remove portions of the stack 150 not protected by the spacers 112, thereby forming two epitaxy nanosheet stacks 150. The etching continues into the sacrificial bottom isolation layer 104. Lower portions of the sacrificial bottom isolation layer 104 have the reduced height or thickness T2, and the etching can be RIE.

Figure 3:
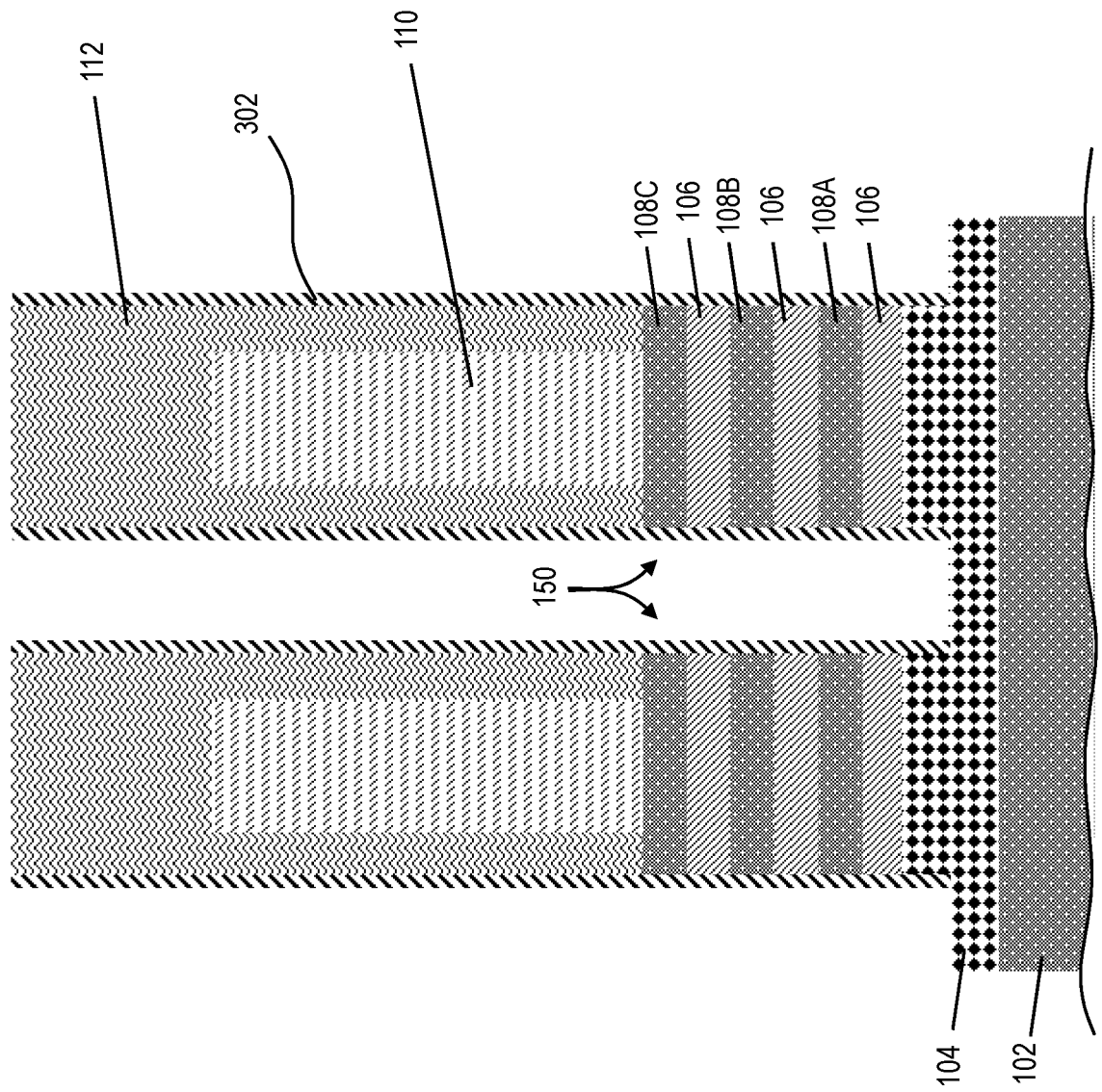
FIG. 3 depicts a cross-sectional view of the semiconductor device according to embodiments of the invention.

FIG. 3 depicts a cross-sectional view of a semiconductor device 100 according to embodiments of the invention. A thin oxide spacer 302 is formed on sides of the spacers 112, the sacrificial layers 106, channel layers 108, and upper portions of the sacrificial bottom isolation layer 104. Chemical mechanical polishing/planarization (CMP) can be performed to remove the material of the oxide spacer 302 from the top of the spacers 112. The oxide spacer 302 can be, for example, any oxide based material such as silicon dioxide (SiO$_2$). The oxide spacer 302 protects the (SiGe) sacrificial layers 106 during subsequent fabrication processes.

Figure 4A:
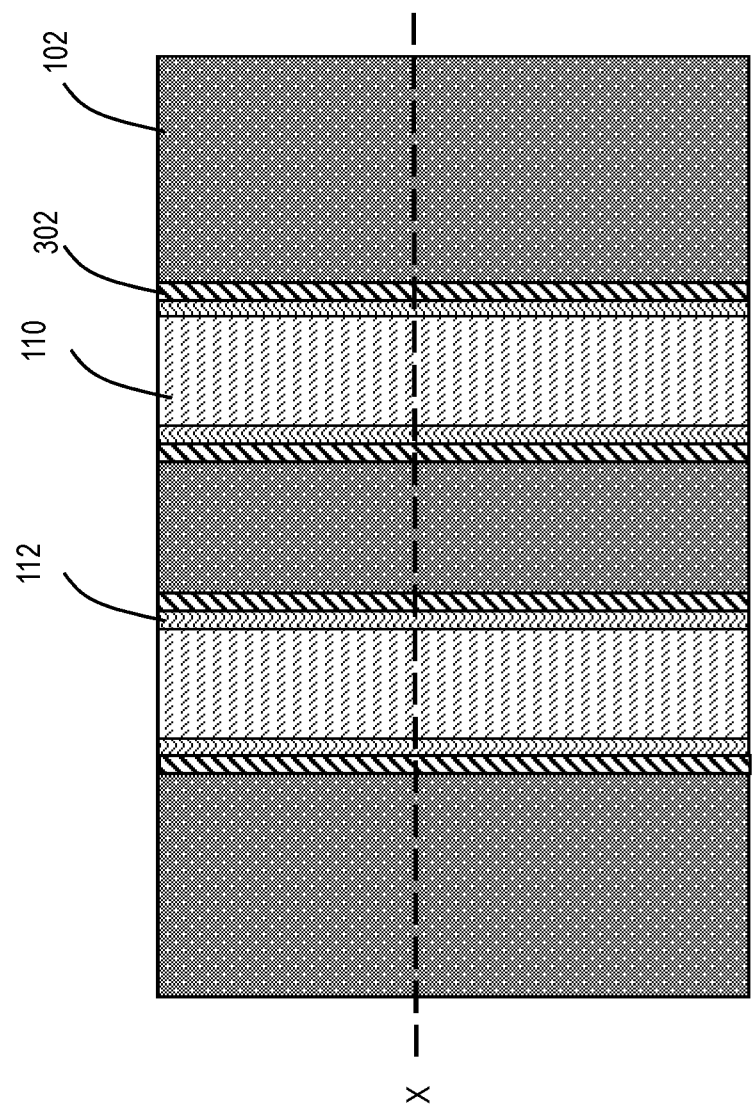
FIG. 4A depicts a simple diagram of a top view of the semiconductor device according to embodiments of the invention.

FIG. 4A depicts a simple diagram of a top view of the semiconductor device 100 according to embodiments of the invention. FIG. 4A omits some layers or details not necessary for understanding aspects of the invention. For example, shallow trench isolation (STI) regions can be formed in the field areas or areas that will not be active for the transistor. FIG. 4B depicts a cross-sectional view of the semiconductor device 100 taken along line X of FIG. 4A according to embodiments of the invention. Etching is performed to selectively remove the sacrificial bottom isolation layer 104 resulting in cavities 402, while not etching sacrificial layers 106 and channel layers 108, as seen in FIG. 4B. Dilute HCl or ClF3 can be used to selectively etch the sacrificial bottom isolation layer 104, thereby forming cavities 402. The SiGe sacrificial bottom isolation layer 104 contains a higher concentration of germanium (e.g., 50% atomic percent Ge) than the SiGe sacrificial layers 106 (e.g., 20% atomic percent Ge), which facilitates the etching of the sacrificial bottom isolation layer 104 selective to sacrificial layers 106. Additionally, as further protection, the oxide spacer 302 protects the (SiGe) sacrificial layers 106 during the etch. Although the nanosheet stacks 150 might appear to be floating over the substrate 102, it should be appreciated that the gate material of dummy gates 110 anchors the nanosheet stacks 150 as depicted in FIG. 4A (where portions of the overlayer of spacers 112 have intentionally been omitted to view dummy gates 110 underneath) and as understood by one skilled in the art.

FIG. 5 depicts a cross-sectional view of the semiconductor device 100 according to embodiments of the invention. Conformal deposition of a low-k dielectric liner 502 is performed. The low-k dielectric liner 502 is formed in and pinches off the cavities 402 (shown in FIG. 4B), thereby forming air gaps 504. The low-k dielectric liner 502 can be a nitride based material, such as silicon nitride (SiN). In some embodiments of the invention, the low-k dielectric liner 502 can be hafnium oxide, although the nitride based material provides better selectively during subsequent fabrication processes. Additionally, the low-k material low-k dielectric liner 502 can include boron doped and/or carbon doped silicon nitride film (SiBCN).

FIG. 6 depicts a cross-sectional view of the semiconductor device 100 according to embodiments of the invention. Etching is performed to remove portions of the low-k dielectric liner 502, while leaving the pinched off low-k dielectric liner 502 in the regions of the cavities 402. The remaining low-k dielectric liner 502 has been formed into a support structure 602 underneath the nanosheet stacks 150 and the oxide spacer 302. The support structure 602 includes the air gap 504 surrounded by the low-k dielectric liner 502. An isotropic etch can be utilized to etch back the low-k dielectric liner 502. For example, the wet chemistry for a silicon nitride etch can be mostly phosphoric acid based.

Figure 7:
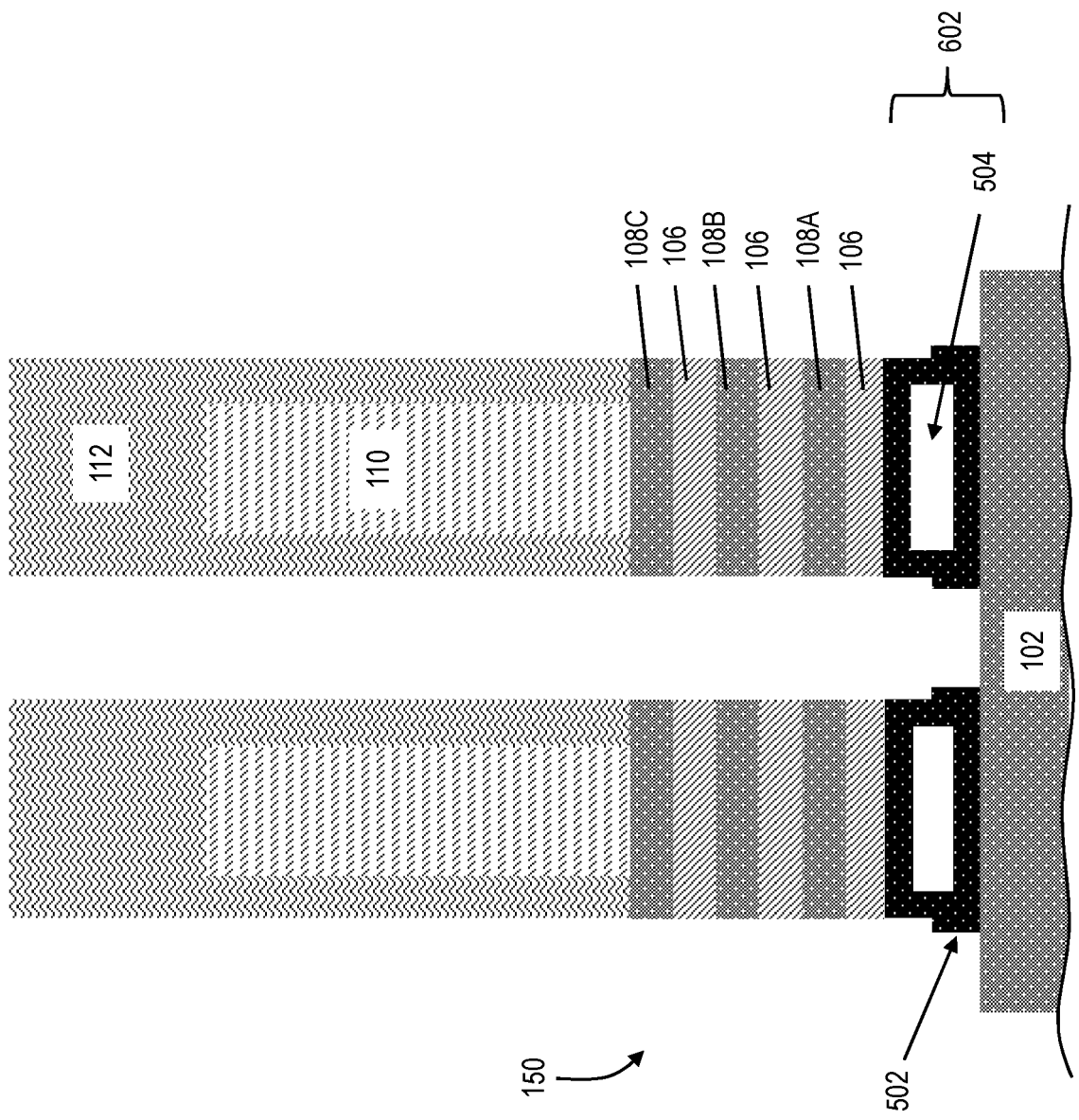
FIG. 7 depicts a cross-sectional view of the semiconductor device according to embodiments of the invention.
Figure 8:
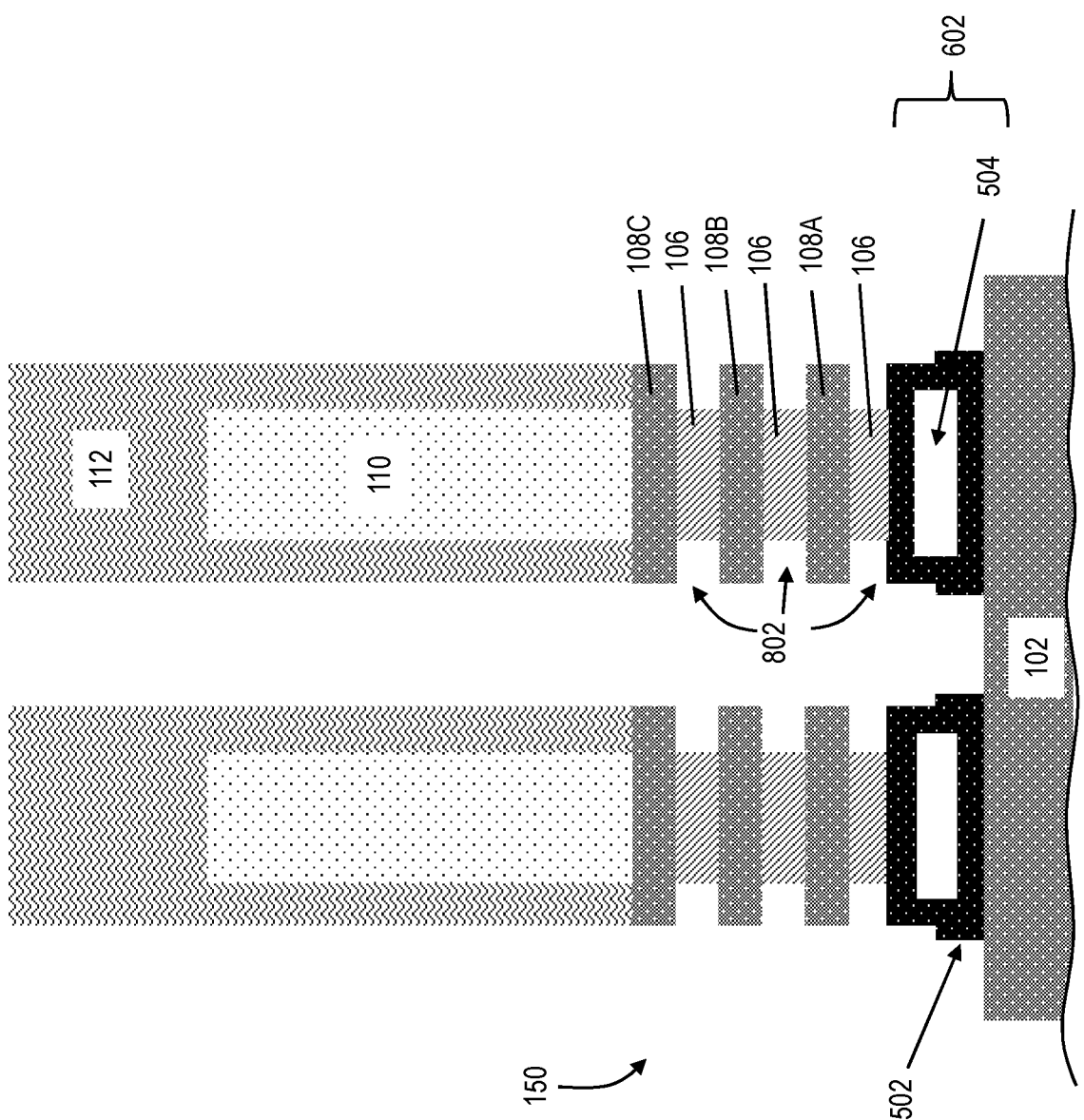
FIG. 8 depicts a cross-sectional view of the semiconductor device according to embodiments of the invention.

FIG. 7 depicts a cross-sectional view of the semiconductor device 100 according to embodiments of the invention. Oxide spacer removal is performed. The material of the oxide spacer 302 is etched selective to the other layers. FIG. 8 depicts a cross-sectional view of the semiconductor device 100 according to embodiments of the invention. Indentations are formed. For example, etching is performed to create indentations 802 by recessing ends of the sacrificial layers 106 selective to the other layers. An example etchant can be HCl or ClF$_3$.

Figure 9:
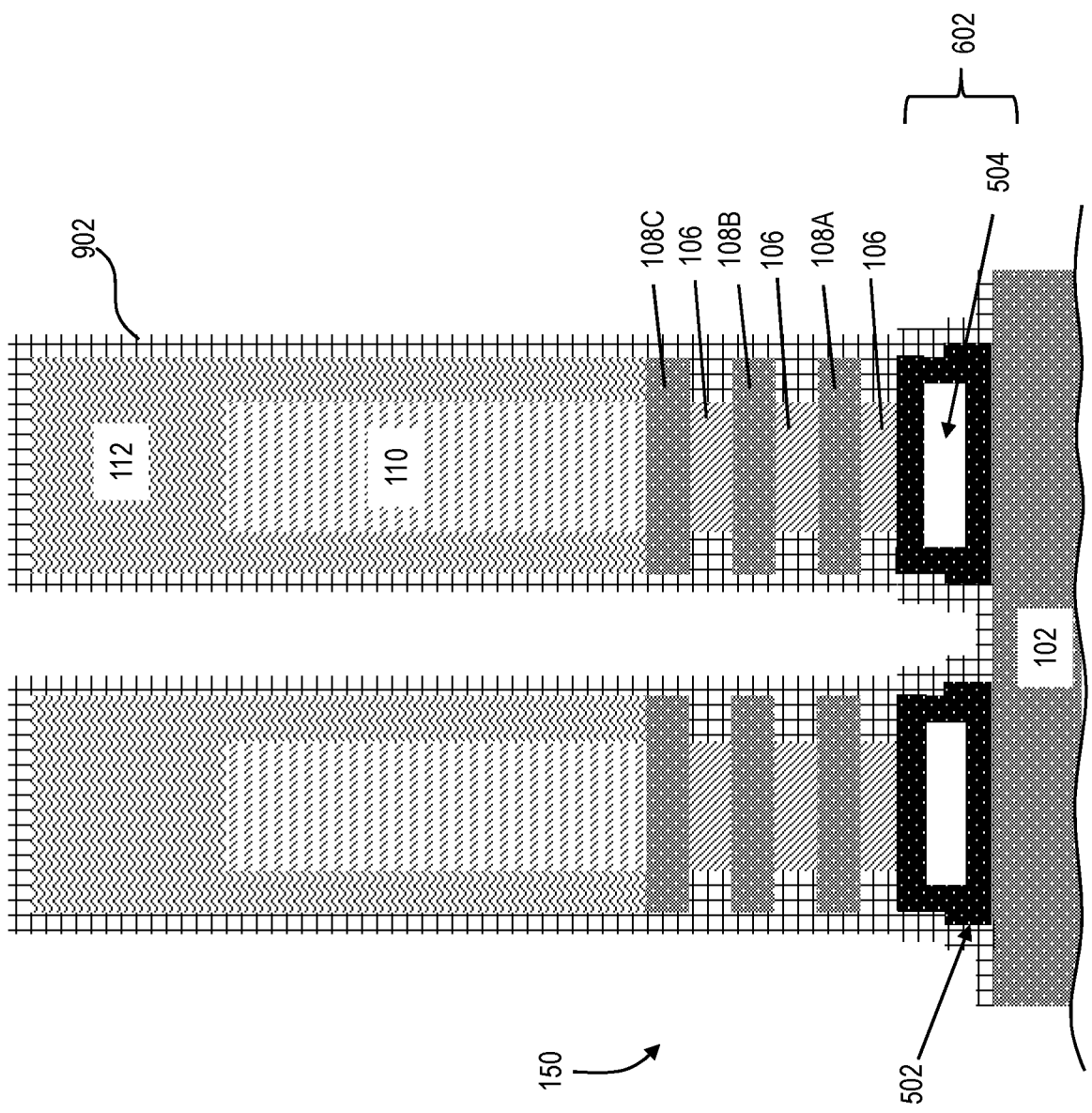
FIG. 9 depicts a cross-sectional view of the semiconductor device according to embodiments of the invention.

FIG. 9 depicts a cross-sectional view of the semiconductor device 100 according to embodiments of the invention. An additional liner 902 is conformally formed on the semiconductor device 100 so as to fill in the identifications 802. The material of the additional liner 902 can be nitride based materials, such as, SiN, SiBCN, etc.

Figure 10:
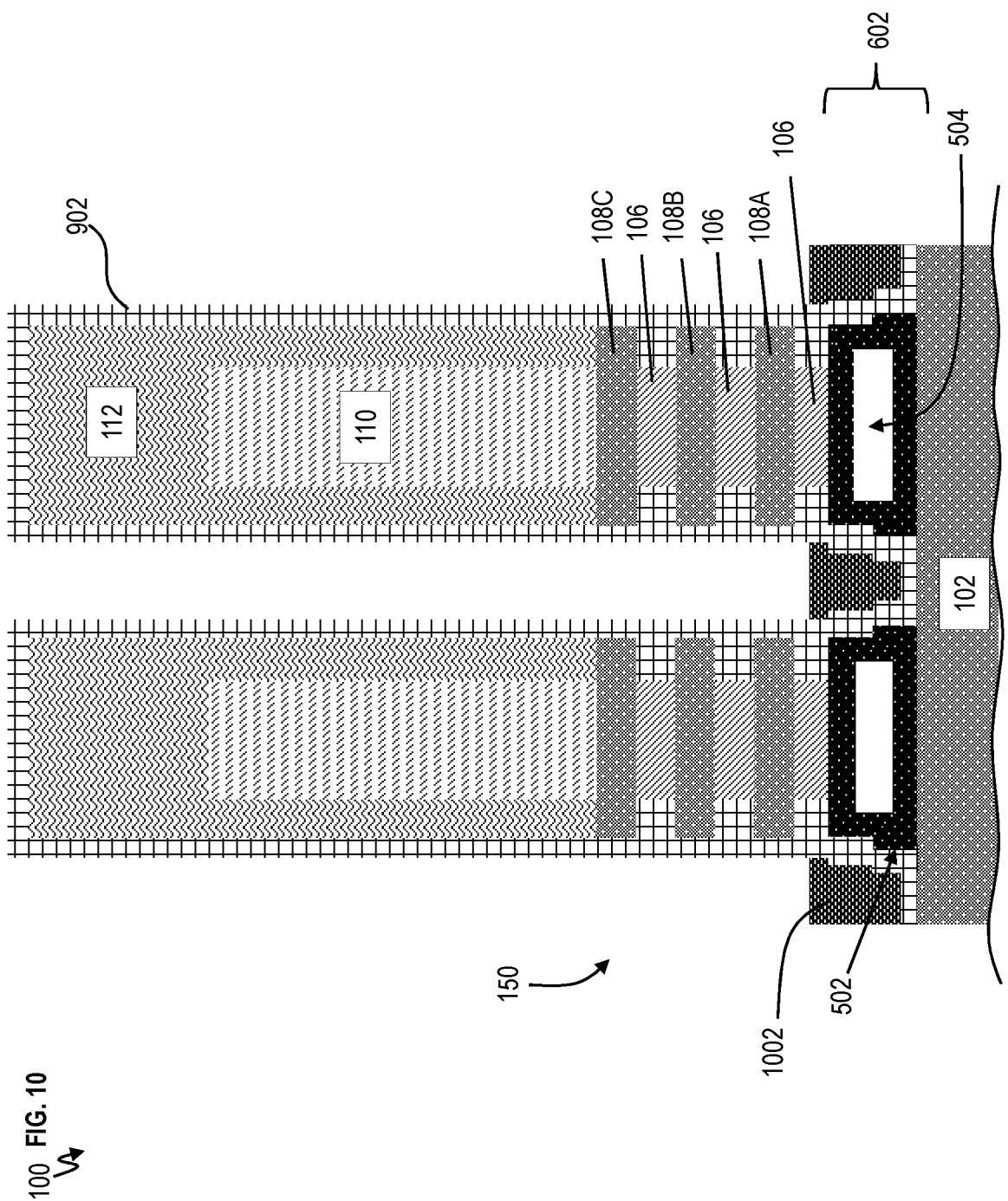
FIG. 10 depicts a cross-sectional view of the semiconductor device according to embodiments of the invention.

FIG. 10 depicts a cross-sectional view of the semiconductor device 100 according to embodiments of the invention. An oxide layer 1002 is deposited on a lower portion of the additional liner 902. The oxide layer 1002 can be high density plasma (HDP) oxide, flowable chemical vapor deposition (FCVD) oxide, etc. For example, the oxide layer 1002 should be deposited first to fill the cavities along the sides of the stacks 150, and then etched back to the desired remaining height as depicted on FIG. 10. The selectivity of etch to the fin can be achieved by using silicon nitride based hardmask at the top of the fins (to protect the fins during the etch), and the hardmask can be subsequently removed. The oxide layer 1002 prevents the epitaxial source/drain regions from growing underneath the channel region under the dummy gates 110, in subsequent fabrication processing.

Figure 11:
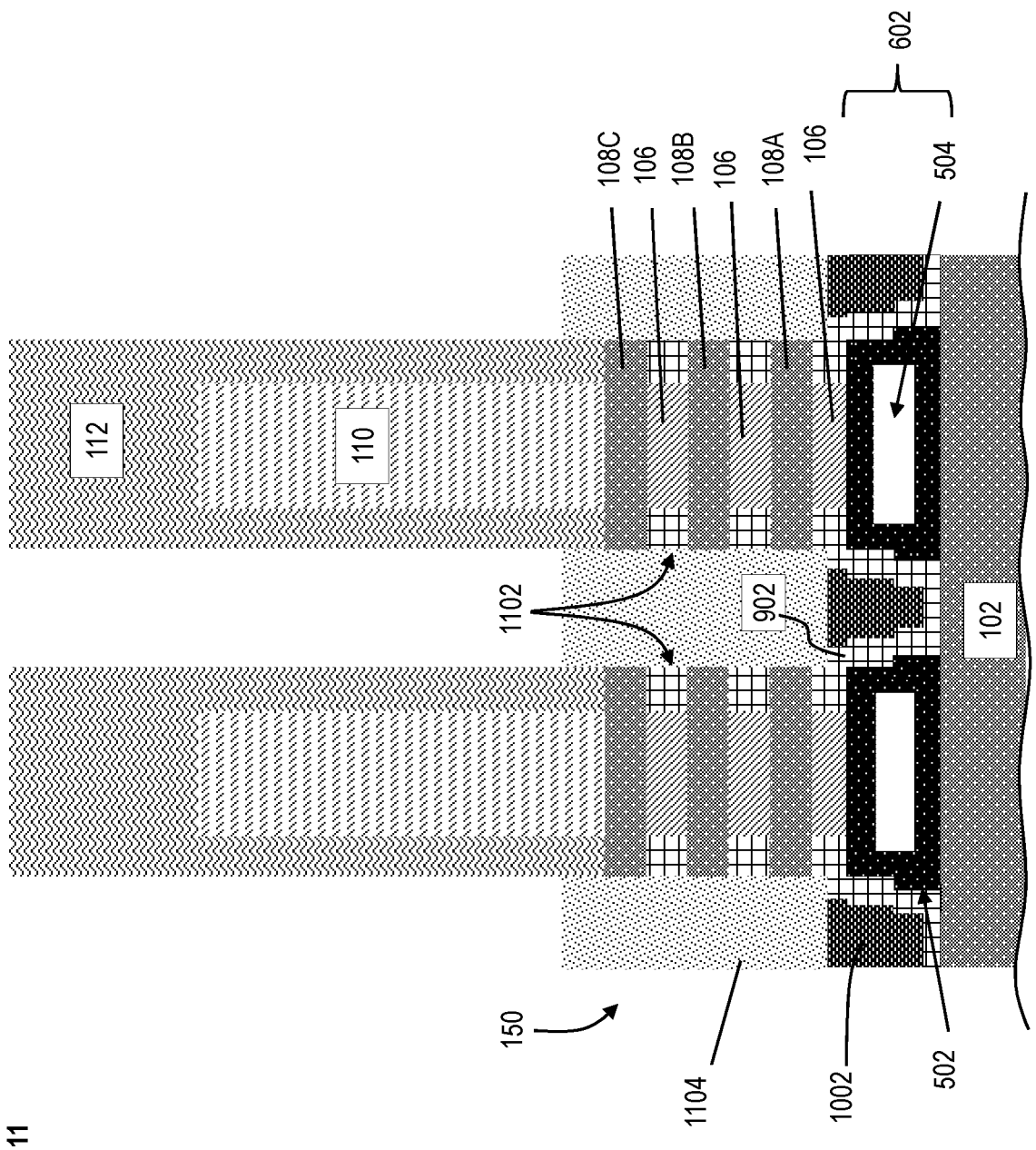
FIG. 11 depicts a cross-sectional view of the semiconductor device according to embodiments of the invention.

FIG. 11 depicts a cross-sectional view of the semiconductor device 100 according to embodiments of the invention. Inner spacer formation and epitaxial growth are performed. The additional liner 902 is etched back such that inner spacers 1102 remain in the previous indentations/cavities 802 (depicted in FIG. 8). Material of the additional liner 902 also remains along sides of and underneath the oxide layer 1002, as well as on the sides of the low-k dielectric liner 502. The low-k dielectric liner 502 has a step-like shape, which causes the additional liner 902 to have a step-like shape, thereby causing the oxide layer 1002 to have a step-like shape.

Formation of source and drain epitaxial regions 1104 is performed. The source/drain epitaxial regions 1104 can be NFET source/drain epitaxial regions or PFET source/drain epitaxial regions according to formation of the NFET or PFET devices. Accordingly, the source/drain epitaxial regions 1104 can be doped with N-type dopants or P-type dopants as desired. The source/drain epitaxial regions 1104 can be epitaxially grown from the edges of the channel layers 108.

Figure 12:
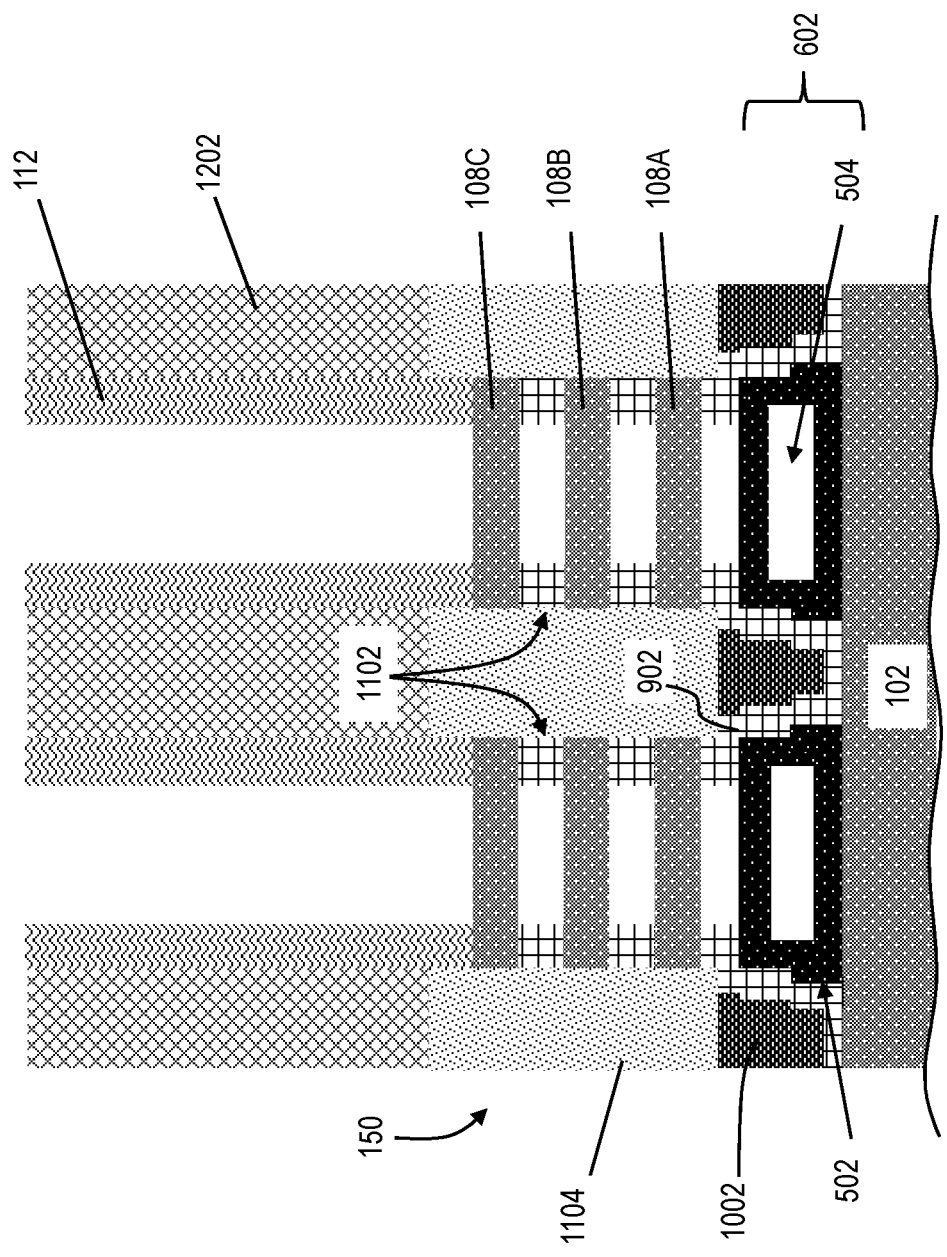
FIG. 12 depicts a cross-sectional view of the semiconductor device according to embodiments of the invention.

FIG. 12 depicts a cross-sectional view of the semiconductor device 100 according to embodiments of the invention. An inter-level dielectric (ILD) material 1202 is deposited to cap the source/drain regions 1104. The ILD material 1202 is a low-k dielectric material such as, for example, an oxide material like silicon dioxide. The ILD material 1202 is then recessed by chemical mechanical polishing (CMP) until the dummy gate 110 is reached. Further, a replacement metal gate (RMG) process is performed. An etch is performed to selectively remove the dummy gate 110, and finally the sacrificial suspension layers 106 are selectively etched to release the channel layers 108. The selective etch of the sacrificial layers 106 creates openings between the channel layers 108.

Figure 13:
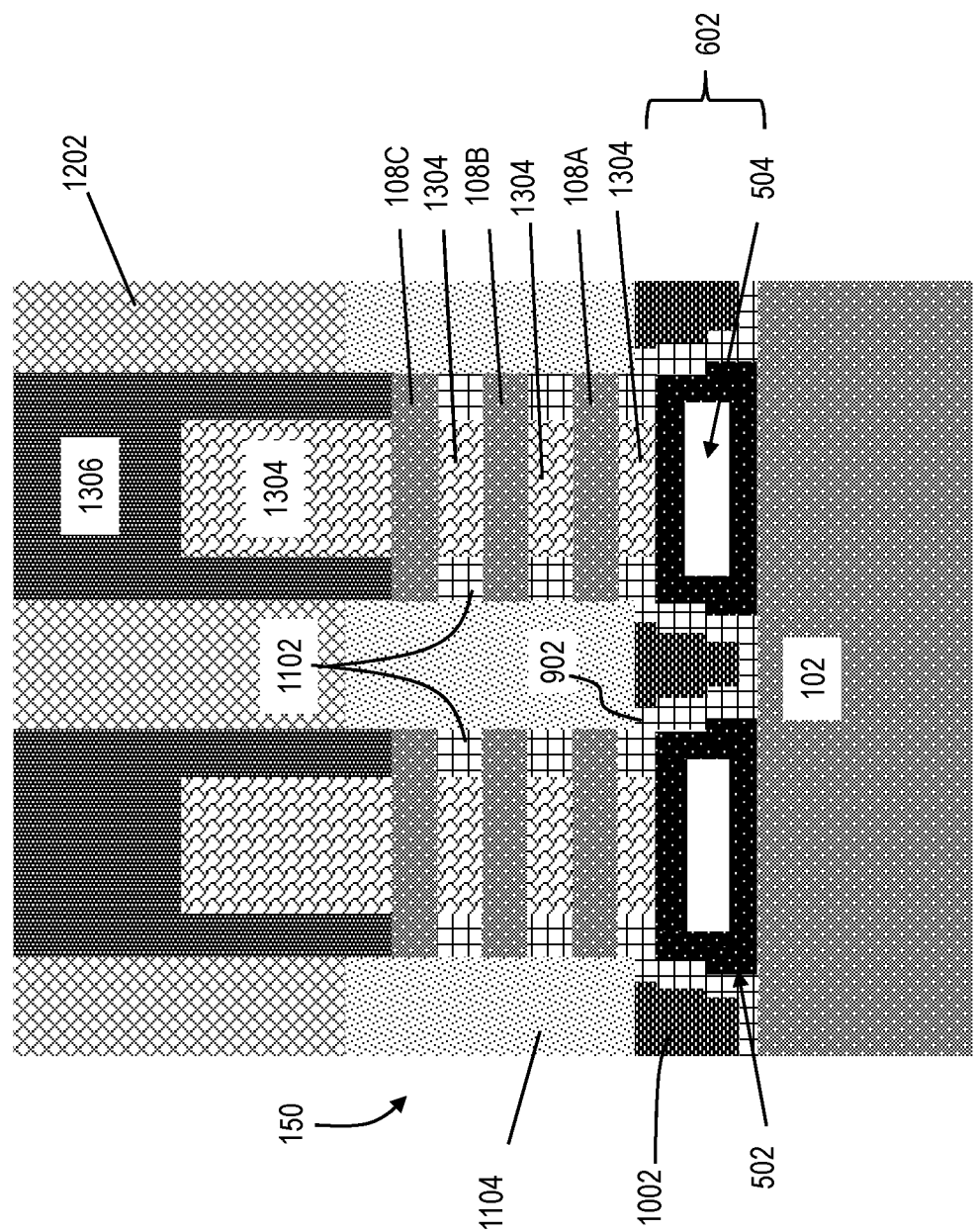
FIG. 13 depicts a cross-sectional view of the semiconductor device according to embodiments of the invention.

FIG. 13 depicts a cross-sectional view of the semiconductor device 100 according to embodiments of the invention. Conformal high-k metal gate (HKMG) formation is then performed to deposit HKMG layers 1304 which fill the previous locations of the sacrificial layers 106, so as to wrap around the channel layers 108. A self-aligned contact (SAC) cap 1306 is formed on top of the HKMG layers 1304. The SAC cap 1306 is an insulating material, such as, a nitride (e.g., SiN), an oxide (e.g., $SiO_2$), etc.

Techniques for forming HKMG in gate openings are well-known in the art and, thus, the details have been omitted in order to allow the reader to focus on the salient aspects of the disclosed methods. However, it should be understood that such HKMG will generally include formation of one or more gate dielectric layers (e.g., an inter-layer (IL) oxide and a high-k gate dielectric layer), which are deposited so as to line the gate openings, and formation of one or more metal layers, which are deposited onto the gate dielectric layer(s) so as to fill the gate openings. The materials and thicknesses of the dielectric and metal layers used for the HKMG can be preselected to achieve desired work functions given the conductivity type of the FET. To avoid clutter in the drawings and to allow the reader to focus on the salient aspects of the disclosed methods, the different layers within the HKMG stack 1304 are not illustrated. For explanation purposes, a high-K gate dielectric layer can be, for example, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). Optionally, the metal layer(s) can include a work function metal that is immediately adjacent to the gate dielectric layer and that is preselected in order to achieve an optimal gate conductor work function given the conductivity type of the nanosheet-FET. For example, the optimal gate conductor work function for the PFETs can be, for example, between about 4.9 eV and about 5.2 eV. Exemplary metals (and metal alloys) having a work function within or close to this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The optimal gate conductor work function for NFETs can be, for example, between 3.9 eV and about 4.2 eV. Exemplary metals (and metal alloys) having a work function within or close to this range include, but are not limited to, hafnium, zirconium, titanium, tantalum, aluminum, and alloys thereof, such as, hafnium carbide, zirconium carbide, titanium carbide, tantalum carbide, and aluminum carbide. The metal layer(s) can further include a fill metal or fill metal alloy, such as tungsten, a tungsten alloy (e.g., tungsten silicide or titanium tungsten), cobalt, aluminum or any other suitable fill metal or fill metal alloy.

As can be seen in FIG. 13, the oxide layer 1002 and the additional liner 902 separate/block the source/drain epitaxial regions 1104 from the substrate 102 underneath, thereby preventing parasitic transistor leakage from one source/drain region to an adjacent source/drain region. Also, the low-k dielectric liner 502 with air gap 504 supports the additional liner 902 and the oxide layer 1002. It should be appreciated that embodiments of the invention provide full bottom dielectric isolation of both the source/drain epitaxial regions 1104 and the nanosheet stack 150 from the substrate 102.

FIG. 14 depicts a flowchart 1400 of a method of forming a semiconductor device 100 according to embodiments of the invention. At block 1402, the stack 150 is formed over a bottom sacrificial layer 104, the bottom sacrificial layer 104 being on a substrate 102. At block 1404, the bottom sacrificial layer 104 is removed so as to create an opening 402 under the stack, a dummy gate 110 anchoring the stack 150. At block 1406, a support structure 602 is formed in the opening 402, the support structure 602 including an air gap 504 and being positioned between the stack 150 and the substrate 102. At block 1408, one or more layers (e.g., layer 902 and/or layer 1002) are formed on the support structure 602. At block 1410, source or drain regions 1104 over the one or more layers, such that the source or drain regions 1104 are isolated from the substrate 102.

The support structure 602 includes a dielectric material (i.e., low-k dielectric liner 502). The support structure 602 includes a nitride material. The support structure 602 includes silicon nitride. The one or more layers include a liner layer 902 formed on the support structure 602. The one or more layers include a liner layer 902 formed on the support structure 602 and a filler layer 1002 formed on the liner layer 902. The liner layer 902 a nitride material. The liner layer 902 includes a material selected from the group consisting of silicon nitride and silicon boron carbide nitride. The filler layer 1002 includes an oxide material. The support structure 602 includes a step-like shape.

Additionally, a method of forming a semiconductor device 100 is provided. The method includes forming a stack 150 over a bottom sacrificial layer 104, the bottom sacrificial layer 104 being on a substrate 102, forming a dummy gate 110 over the stack, 150, forming a protective liner 302 on the stack 150. Also, the method includes removing the bottom sacrificial layer 104 so as to create an opening 402 under the stack 150 while the protective liner 302 is on the stack 150, the dummy gate 110 anchoring the stack 150, forming a support structure 602 in the opening 402, the support structure 602 including an air gap 504 and being positioned between the stack 150 and the substrate 102. Further, the method includes removing the protective liner 302, forming one or more layers on the support structure 602, and forming source or drain regions 1104 over the one or more layers, such that the source or drain regions 1104 are isolated from the substrate 102.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of forming a semiconductor device, the method comprising:
   forming a stack over a bottom sacrificial layer, the bottom sacrificial layer being on a substrate;
   removing the bottom sacrificial layer so as to create an opening under the stack, the opening being between the stack and the substrate;
   forming a support structure in the opening between the stack and the substrate, the support structure enclosing an air gap directly under the stack;
   forming one or more layers on the support structure and the stack; and
   forming source or drain regions over the one or more layers, such that the source or drain regions are isolated from the substrate.

2. The method of claim 1, wherein the support structure comprises a dielectric material.

3. The method of claim 1, wherein the support structure comprises a nitride material.

4. The method of claim 1, wherein the support structure comprises silicon nitride.

5. The method of claim 1, wherein the one or more layers comprise a liner layer formed on the support structure.

6. The method of claim 1, wherein the one or more layers comprise a liner layer formed on the support structure and a filler layer formed on the liner layer.

7. The method of claim 6, wherein the liner layer comprises a nitride material.

8. The method of claim 6, wherein the liner layer comprises a material selected from the group consisting of silicon nitride and silicon boron carbide nitride.

9. The method of claim 6, wherein the filler layer comprises an oxide material.

10. The method of claim 1, wherein the support structure comprises a step-like shape.

11. A method of forming a semiconductor device, the method comprising:
    forming a stack over a bottom sacrificial layer, the bottom sacrificial layer being on a substrate;
    forming a dummy gate over the stack;
    forming a protective liner on the stack;
    removing the bottom sacrificial layer so as to create an opening under the stack while the protective liner is on the stack, the opening being between the stack and the substrate;
    forming a support structure in the opening between the stack and the substrate, the support structure enclosing an air gap directly under the stack;
    removing the protective liner;
    forming one or more layers on the support structure and the stack; and
    forming source or drain regions over the one or more layers, such that the source or drain regions are isolated from the substrate.

* * * * *